United States Patent [19]
Ikawa et al.

[11] Patent Number: 5,394,421
[45] Date of Patent: Feb. 28, 1995

[54] SEMICONDUCTOR LASER DEVICE INCLUDING A STEP ELECTRODE IN A FORM OF EAVES

[75] Inventors: Katsuhiko Ikawa; Yukio Shakuda; Hiroshi Matagi, all of Kyoto, Japan

[73] Assignee: Rohm Co., Ltd., Kyoto, Japan

[21] Appl. No.: 161,425

[22] Filed: Dec. 6, 1993

[30] Foreign Application Priority Data

Jan. 11, 1993 [JP] Japan ................................. 5-002738
Jul. 9, 1993 [JP] Japan ................................. 5-170251
Jul. 14, 1993 [JP] Japan ................................. 5-174474

[51] Int. Cl.$^6$ ............................................. H01S 3/19
[52] U.S. Cl. ...................................... 372/45; 372/44; 372/46; 372/47
[58] Field of Search ................... 372/45, 46, 50, 44, 372/47, 34

[56] References Cited

U.S. PATENT DOCUMENTS

| | | | |
|---|---|---|---|
| 4,506,366 | 3/1985 | Chinone et al. | 372/45 |
| 4,817,103 | 3/1989 | Holonyak, Jr. et al. | 372/45 |
| 4,890,293 | 12/1989 | Taneya et al. | 372/46 |
| 5,010,376 | 4/1991 | Nishimura et al. | 372/45 X |
| 5,151,913 | 9/1992 | Ueno | 372/46 |
| 5,218,613 | 6/1993 | Serreze | 372/45 |
| 5,280,535 | 1/1994 | Gfeller et al. | 372/46 |

FOREIGN PATENT DOCUMENTS 58-33886  5/1983  Japan .

*Primary Examiner*—Rodney B. Bovernick
*Assistant Examiner*—Hemang Sanghavi
*Attorney, Agent, or Firm*—Nikaido, Marmelstein, Murray & Oram

[57] ABSTRACT

A highly reliable semiconductor laser device capable of exhibiting a good current-light output characteristic and a fabrication process therefore is provided. The semiconductor laser device is provided with a step in a region adjacent a laser-light-emitting edge to separate an upper electrode into two, one of which is located adjacent the laser-light-emitting edge and does not allow current to flow in the underlying portion even if the other is applied with voltage, thereby forming a current-noninjection region in the region adjacent the later-light-emtting edge. Due to such an arrangement, deterioration of device characteristics due to local heat generation can be assuredly prevented without changing the structure adjacent the active layer and the current-confining structure which dominate the characteristics of the semiconductor laser.

11 Claims, 9 Drawing Sheets

SEMICONDUCTOR LASER DEVICE INCLUDING A STEP ELECTRODE IN A FORM OF EAVES

FIELD OF THE INVENTION

The present invention relates to semiconductor laser devices and, more particularly, to a semiconductor device of prolonged life wherein a current-noninjection region is provided adjacent an end of a resonator waveguide to prevent deterioration or damage of laser-light-emitting edge, and to a method for fabricating the same.

BACKGROUND OF THE INVENTION

Nowadays, semiconductor lasers are widely used as light sources for use with optical information equipment. Of these lasers, those for use with an optical disk of write-once type or overwritable type and the like are desired to output a high power and exhibit high reliability.

Deterioration or damage of the laser-light-emitting edge of a semiconductor laser is regarded as one of the factors of decreased reliability thereof. In an attempt to overcome such a problem, Japanese Unexamined Patent Publication No. 239679/1991, for example, discloses a method for restraining generation of heat in an edge portion due to Joule's heat by forming a current-noninjection region in the edge portion.

Figure 7A:
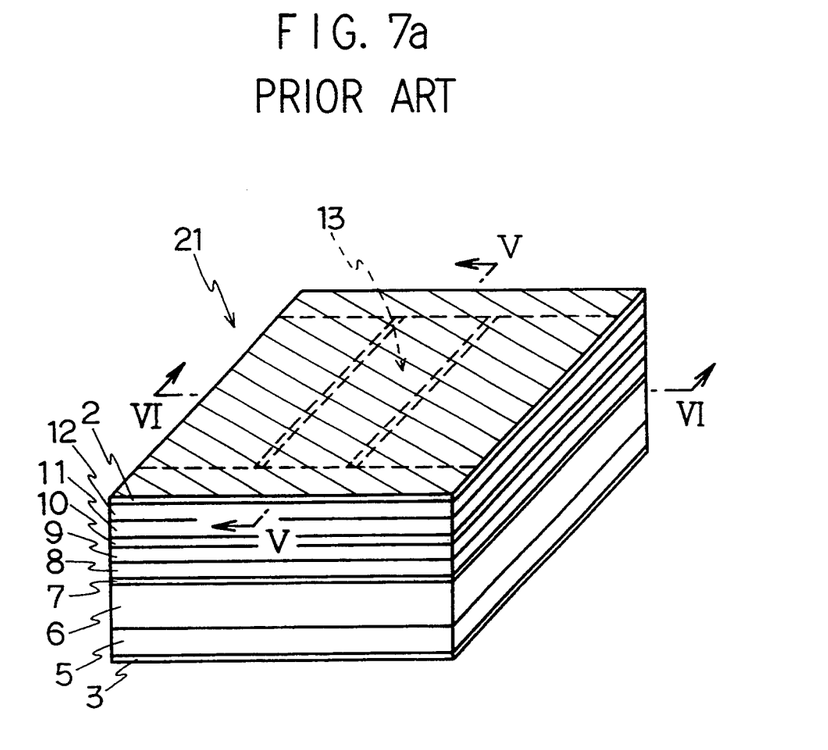
FIG. 7a is a perspective view thereof.
Figure 7B:
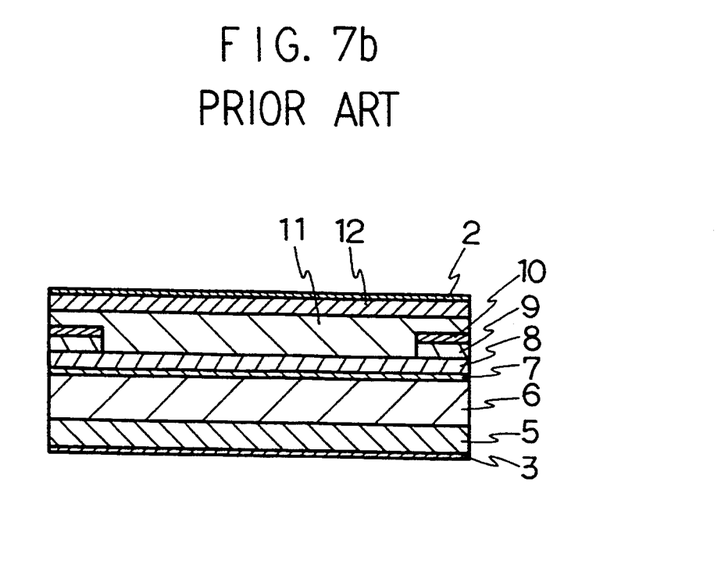
Figure 7C:
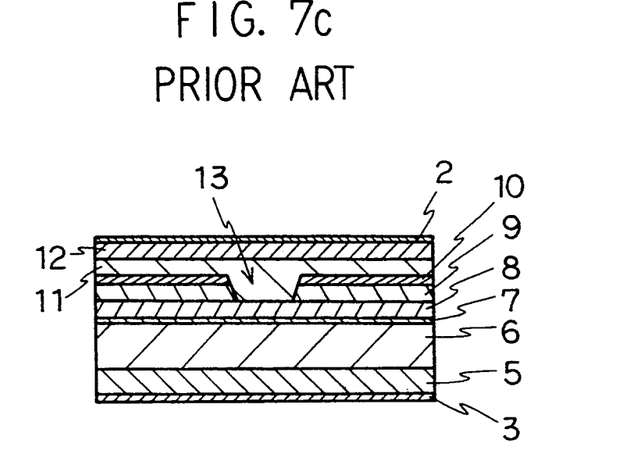

FIG. 7 generally shows a semiconductor laser of the conventional type having a current-noninjection region in the laser-light-emitting edge portion. This laser is of a self-aligned structure having the current-noninjection region formed adjacent an end of resonator waveguide. It is noted that FIG. 7a is a perspective view of the semiconductor laser, FIG. 7b is a sectional view taken along line V—V of FIG. 7a, and FIG. 7c is a sectional view taken along line VI—VI of FIG. 7a.

As shown in FIG. 7a, semiconductor laser 21 is fabricated in the following manner. On semiconductor substrate 5 such as made of n-GaAs are sequentially stacked lower clad layer 6 such as made of n-$Al_xGa_{1-x}As$, active layer 7 of $Al_yGa_{1-y}As$, first upper clad layer 8 of p-$Al_xGa_{1-x}As$, current-blocking layer 9 of n-GaAs, and evaporation-preventive layer 10 of n-$Al_{0.15}Ga_{0.85}As$. The upper surface of the resulting structure is etched to form stripe cavity 13 reaching first upper clad layer 8, followed by stacking second upper clad layer 11 of p-$Al_xGa_{1-x}As$ and contact layer 12 of p-GaAs. Finally, second electrode 2 and first electrode 3 are respectively formed on the upper and lower surfaces of the resulting structure, namely on the upper surface of contact layer 12 and on the lower surface of semiconductor substrate 5, and the resultant is cut into chips.

The above mentioned stripe cavity 13 is defined in a central portion of the chip and surrounded by current-blocking layer 9 and evaporation-preventive layer 10 as shown in FIGS. 7b and 7c. In this structure, current will not flow in the laser-light-emitting edge portion because current-blocking layer 9 and evaporation-preventive layer 10 are partially retained in that portion as shown in FIG. 7b. Hence, the edge portion becomes a current-noninjection portion which serves to restrain generation of heat due to Joule's heat thereby making the laser-light-emitting edge hard to deteriorate or damage.

However, such a conventional semiconductor laser uses a direct transition material, such as GaAs, for the current-blocking layer formed in the laser-light-emitting edge portion and, hence, light absorption occurs in this portion. This results in a problem of unsatisfactory current-light output characteristic.

SUMMARY OF THE INVENTION

It is, therefore, an object of the present invention to overcome the foregoing problems and to provide a semiconductor laser exhibiting a good current-light output characteristic while offering a high reliability with the laser-light-emitting edge made hard to deteriorate or damage.

According to one aspect of the present invention, there is provided a semiconductor laser device comprising:

a first electrode provided on a first electrode-forming-surface;

a second electrode provided on a second-electrode-forming surface; and a plurality of semiconductor layers provided between the first and second electrodes, the plurality of semiconductor layers including at least:

an active layer having a quantum well structure;

a lower clad layer provided between the first electrode and the active layer and formed of a semiconductor of a first conductivity type, the semiconductor having a refractive index smaller than that of the active layer and a forbidden band width larger than that of the active layer;

an upper clad layer provided between the second electrode and the active layer and formed of a semiconductor of a second conductivity type, the semiconductor having a refractive index smaller than that of the active layer and a forbidden band width larger than that of the active layer; and a contact layer provided between the upper clad layer and the second electrode and formed of a semiconductor having a refractive index larger than that of the active layer and a forbidden band width smaller than that of the active layer, wherein the second-electrode-forming surface is partially provided with a step which separates the second electrode.

Preferably, the plurality semiconductor layers are individually formed of $Al_qGa_{1-q}As$ ($0 \leq q \leq 1$) and adjusted in refractive index and forbidden band width by varying the content of Al.

Preferably, the active layer is of a quantum well structure for exhibiting a current-light output characteristic of good linearity even in a low power zone.

Preferably, the quantum well structure is a stacked structure comprising an $Al_yGa_{1-y}As$ ($0 \leq y \leq 0.15$) layer and an $Al_zGa_{1-z}As$ ($0.15 \leq z < 0.35$) layer.

Preferably, the step has an undercut portion in its under part to define its upper portion in the form of an eaves, whereby the second electrode can be assuredly separated.

Preferably, the step has a depth larger than the thickness of the contact layer, thereby assuredly forming a current-noninjection region in a region adjacent the laser-light-emitting edge.

Preferably, the step is provided in a laser-light-emitting edge portion to prevent the laser-light-emitting edge portion from deteriorating or damaging.

According to another aspect of the present invention, there is provided a method for fabricating a semiconductor laser device, comprising the steps of:

(a) forming a lower clad layer formed of a semiconductor of a first conductivity type on a semiconductor substrate of the first conductivity type;

(b) forming on the lower clad layer an active layer formed of a semiconductor which is larger in refractive index and smaller in forbidden band width than the lower clad layer;

(c) forming on the active layer an upper clad layer formed of a semiconductor of a second conductivity type which is larger in refractive index and smaller in forbidden band width than the active layer;

(d) forming on the upper clad layer a contact layer formed of a semiconductor of the second conductivity type which is larger in refractive index and smaller in forbidden band width than the active layer;

(e) etching the contact layer to form a step therein; and (f) forming a second electrode on the contact layer in such a manner that the second electrode is separated by the step.

In the above step (e) the contact layer is preferably overetched to form an undercut portion in an under part of the step, whereby an upper portion of the step is shaped like an eaves.

In the semiconductor laser and the method for fabricating the same according to the present invention, the provision of the step in the second-electrode-forming surface causes the second electrode to be separated into a portion on the upper portion of the step and a portion on the lower portion thereof. This results in the formation of a current-noninjection region under a portion of the second electrode. The semiconductor laser of such arrangement can be assuredly prevented from deterioration of laser light characteristics due to local generation of heat without changing the structure dominating laser characteristics, namely the structure adjacent the active layer and the current-confining structure.

If a quantum well structure is employed for the active layer, light absorption loss in the current noninjection region is extremely small as compared with the case of a bulk active layer and, hence, a current-light output characteristic of good linearity can be exhibited.

Further, if both upright surfaces of the step in the second-electrode-forming surface are undercut at its under part thereof to make its upper part shaped like an eaves, an electrode material is not deposited on the shadow portion of the eaves in the formation of the second electrode and, thus, the second electrode can assuredly be separated into a portion on the upper part of the upright surface of the step and a portion on the under part thereof. This results in the formation of a current-noninjection region under a portion of the second electrode thus separated. The semiconductor laser of such arrangement can be assuredly prevented from deterioration of laser light characteristics due to local generation of heat without changing the structure dominating laser characteristics, namely the structure adjacent the active layer and the current-confining structure.

Further, if the step in the second-electrode-forming surface is made to have a depth larger than the thickness of the contact layer, the contact layer is absent under the lower portion of the second electrode and, hence, a depletion layer can be formed in the upper clad layer underlying the lower portion of the second electrode. This makes it possible to assuredly form a current-noninjection layer under the lower portion of the second electrode thereby preventing the device from deteriorating in characteristics due to local generation of heat.

Further, the provision of the step in the laser-light-emitting portion enables the laser-light-emitting edge portion to serve as a current-noninjection region thereby assuredly preventing deterioration of the laser-light-emitting edge portion which is particularly prone to generate heat.

Further, if the contact layer is overetched to undercut the upright surface of the under part of the step, the second electrode can easily be separated into two portions by such a step.

BRIEF DESCRIPTION OF THE DRAWINGS

FIG. 1 shows one embodiment of a semiconductor laser according to the present invention and wherein

FIG. 2 shows another embodiment of the semiconductor laser of the present invention and wherein FIG. 2b is a sectional view thereof taken along line II—II of FIG. 2a;

FIG. 3 illustrates one embodiment of a process for fabricating the semiconductor laser shown in FIG. 1a and wherein

FIG. 7 illustrates one example of a conventional semiconductor laser and wherein FIGS. 7b and 7c are sectional views thereof taken along lines V—V and VI—VI, respectively, of FIG. 7a.

DETAILED DESCRIPTION

A semiconductor laser and a process for fabricating the same according to the present invention will now be described with reference to the drawings.

Figure 1A:
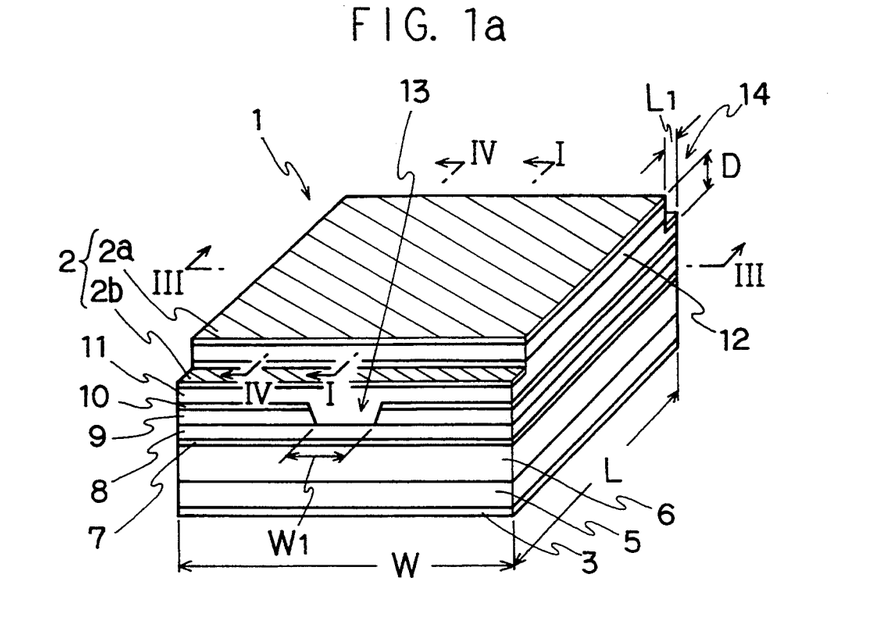
FIG. 1a is a perspective view of the embodiment.

Referring to FIG. 1a, semiconductor laser 1 comprises first electrode 3, second electrode 2 and a plurality of semiconductor layers provided between electrodes 2 and 3. The present invention is characterized in that step 14 is provided in contact layer 12 serving as an electrode-forming surface for second electrode 2 and this step 2 separates second electrode 2 into electrodes 2a and 2b. The electrode 2a is located on an upper portion of the step 14 and electrode 2b is located on a lower portion of the step 14.

The semiconductor layers comprise, stacked in sequence, semiconductor substrate 5 such as made of GaAs of a first conductivity type, lower clad layer 6 which is formed on the semiconductor substrate and made of $Al_xGa_{1-x}As$ ($0.35 \leq x \leq 0.7$) of the first conductivity type or the like, active layer 7 of non-doped or of first or second conductivity type which is formed on the lower clad layer, first upper clad layer 8 which is formed on the active layer and made of $A_xGa_{1-x}As$ or the like of the second conductivity type, current-blocking layer 9 which is formed on the first upper clad layer and made of GaAs of the first conductivity type, evaporation-preventive layer 10 which is formed on the current-blocking layer made of $Al_pGa_{1-p}As$ ($0.1 \leq p \leq 0.7$) of the first conductivity type, second upper clad layer 11 which is formed on the evaporation-preventive layer and made of $Al_xGa_{1-x}As$ of the second conductivity type, and contact layer 12 which is formed on the second upper clad layer and made of GaAs of the second conductivity type. In this structure, clad layers 6 and 8 are made to have a refractive index smaller than that of active layer 7 and a forbidden band width larger than that of the same so that light produced in active layer 7 will not be deflected into or absorbed by clad layers 6 and 8. If AlGaAs is used for clad layers 6 and 8 and active layer 7, such a relation between clad layers and active layer in relation to refractive index and forbidden band width can be easily obtained by varying the Al content of AlGaAs since the refractive index decreases and the forbidden band width increases as the Al content of AlGaAs increases. Further, contact layer 10 is formed of a material, such as GaAs, which can be doped with carrier at a high concentration so as to make ohmic contact with the electrode easily. It is noted that electrodes 2 and 3 are formed on an electrode-forming surface of contact layer 12 and that of semiconductor substrate 5, respectively. In case that a step is formed in the electrode-forming surface for second electrode 2 and the lower portion of the step is formed of second upper clad layer 11, the exposed portion of second upper clad layer 11 forms a part of the electrode-forming surface.

Stripe cavity 13 having a width $W_1$ of about 2 to 6 μm extends centrally of current-blocking layer 9 of and evaporation-preventive layer 10 and confines current flowing between upper clad layers 8 and 11 and lower clad layer 6 within a narrow area of stripe cavity 13 along which a waveguide is formed.

Figure 1B:
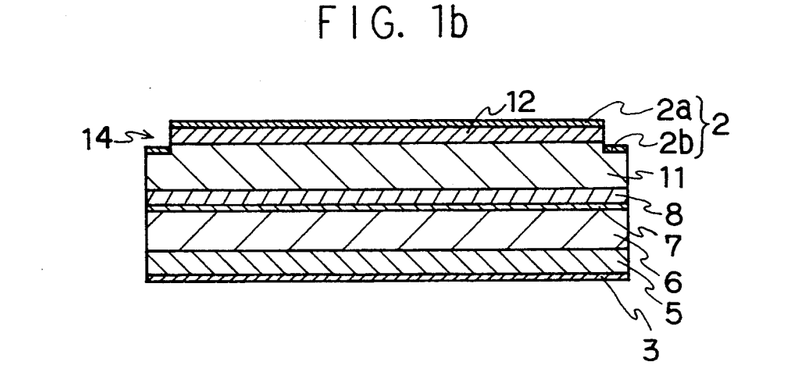
FIG. 1b is a sectional view thereof taken along line I—I of FIG. 1a, and FIG. 1c is a diagram showing a change in Al content of the quantum well active layer.
Figure 1C:
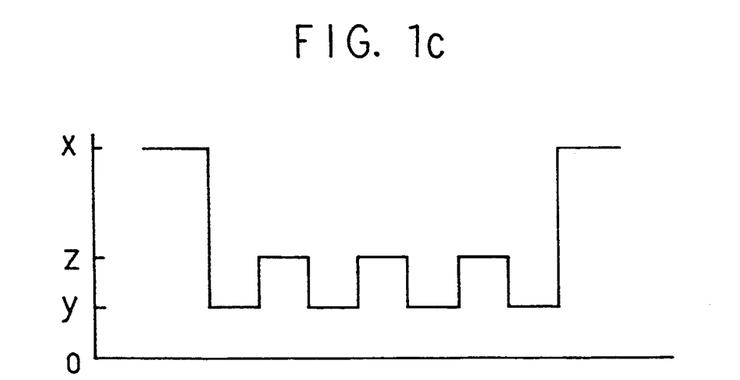

Active layer 7 is of a quantum well structure wherein, as shown in FIG. 1c, $Al_yGa_{1-y}As$ ($0 \leq y \leq 0.15$) layer of 50 to 150 Å thickness and $Al_zGa_{1-z}As$ ($0.15 \leq z \leq 0.35$) layer of 30 to 50 Å thickness are alternately stacked to have 2 to 5 layers in total. The quantum well active layer is smaller in light absorption loss than a bulk active layer and, hence, little light absorption occurs in the current-noninjection region. This results in a current-light output characteristic of good linearity. In particular, this effect is conspicuous if the current-noninjection region is formed by providing a step.

Although the active layer assumes a quantum well structure in the following description for the above-mentioned reason, it may be of a bulk active layer formed of a material, for example $Al_uGa_{1-u}As$ ($0 \leq u \leq 0.2$), which is larger in refractive index than a common clad layer.

In semiconductor laser 1 according to the present invention, second electrode 2 is completely separated into, for example, electrode 2a on the central portion and electrode 2b on the edge portion. Hence, when a voltage is applied only to electrode 2a on the central portion, current will not flow in the edge portion underlying electrode 2b. In other words the region adjacent the laser-light-emitting edge becomes a current-noninjection region thereby preventing the laser-light-emitting edge portion from deteriorating or being damaged due to heat generation. The length $L_1$ of the step in this edge portion is preferably about 10 to about 30 μm when the length of the resonator is within the range of 300 to 600 μm. Although the length $L_1$ is desired to be made larger in view of the prevention of heat generation, current density increases as the length $L_1$ increases and, hence, the life of the device is shortened. When the effect of prolonging the life is also taken into consideration, the length $L_1$ is preferably about 10 to about 30 μm.

It is noted that in the present invention the first conductivity type is referred to as p-type or n-type and if the first conductivity type is p-type, the second conductivity type is n-type, while if the first conductivity type is n-type, the second conductivity type is p-type.

In case that the step formed in the second-electrode-forming surface has a depth larger than the thickness of the contact layer, the electrode-forming surface for second electrode 2b in the lower portion of step 14 formed in the edge portion is formed of second upper clad layer 11 and, hence, ohmic contact is not provided between electrode 2b and the electrode-forming surface. Therefore, a depletion layer is formed under the second electrode 2b thereby assuredly forming a current-noninjection region in the region adjacent the laser-light-emitting edge.

Figure 2A:
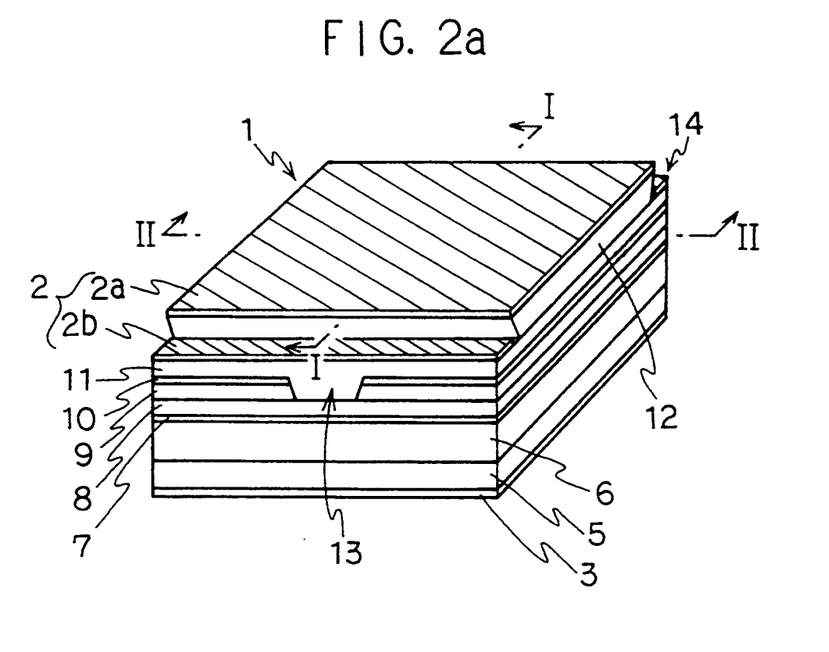
FIG. 2a is a perspective view of the embodiment.
Figure 2B:
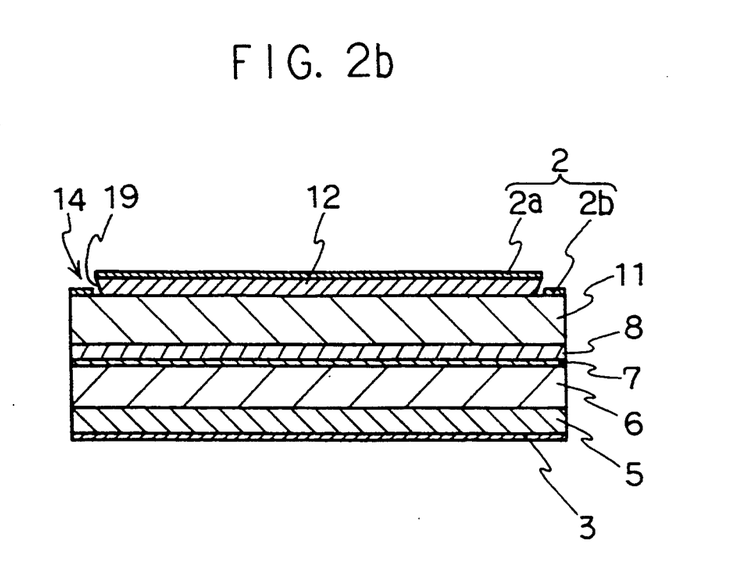

FIGS. 2a and 2b illustrate another embodiment of the semiconductor laser according to the present invention. This embodiment is characterized in that both upright surface of step 14 having undercut portion 19 in the under part thereof is provided in the second-electrode-forming surface. The provision of recess 19 makes the upper portion of step 14 shaped like eaves and thereby electrodes 2a and 2b separated can assuredly be electrically isolated from each other.

Figure 3A:
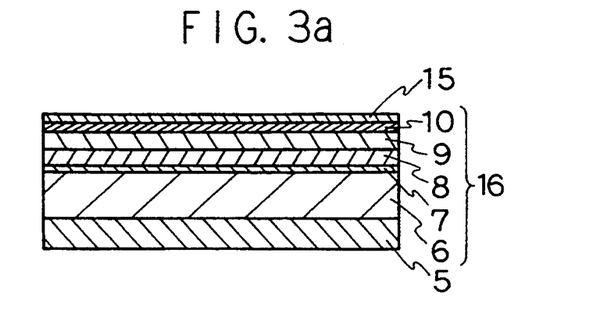
FIGS. 3a to 3d are sectional views taken along line III—III of FIG. 1a at corresponding steps.
Figure 3B:
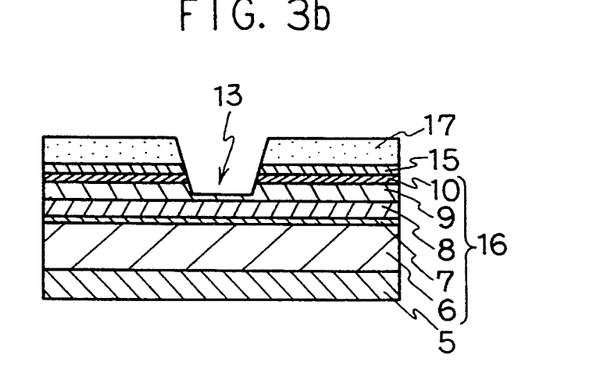
Figure 3C:
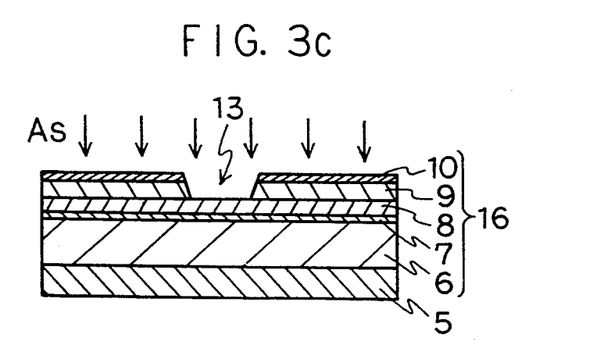
Figure 3D:
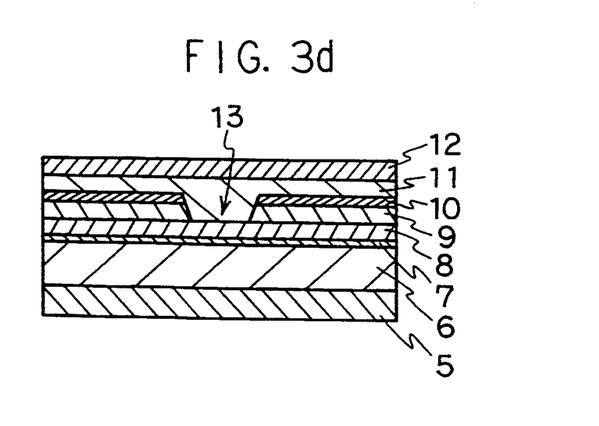
Figure 3E:
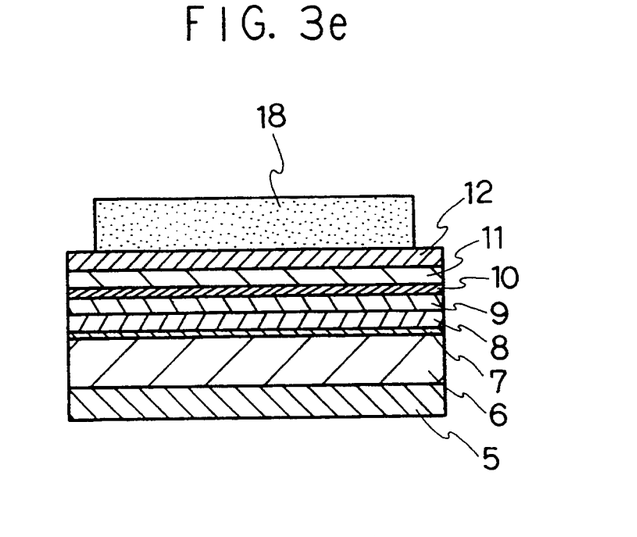
FIGS. 3e and 3f are sectional views taken along line IV—IV of FIG. 1a at corresponding steps.
Figure 3F:
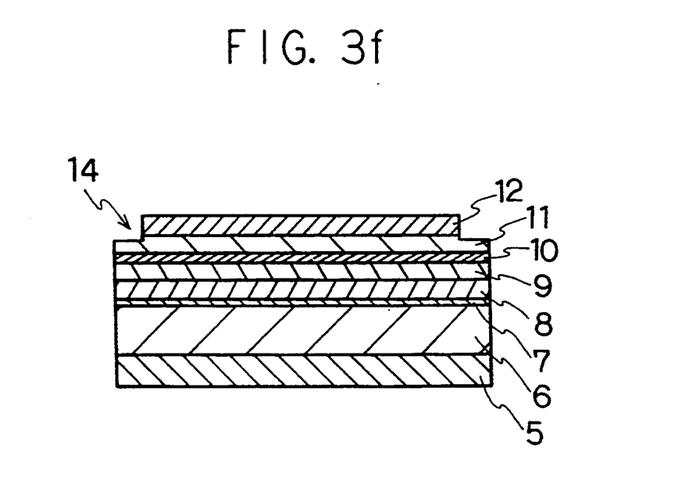
Figure 4:
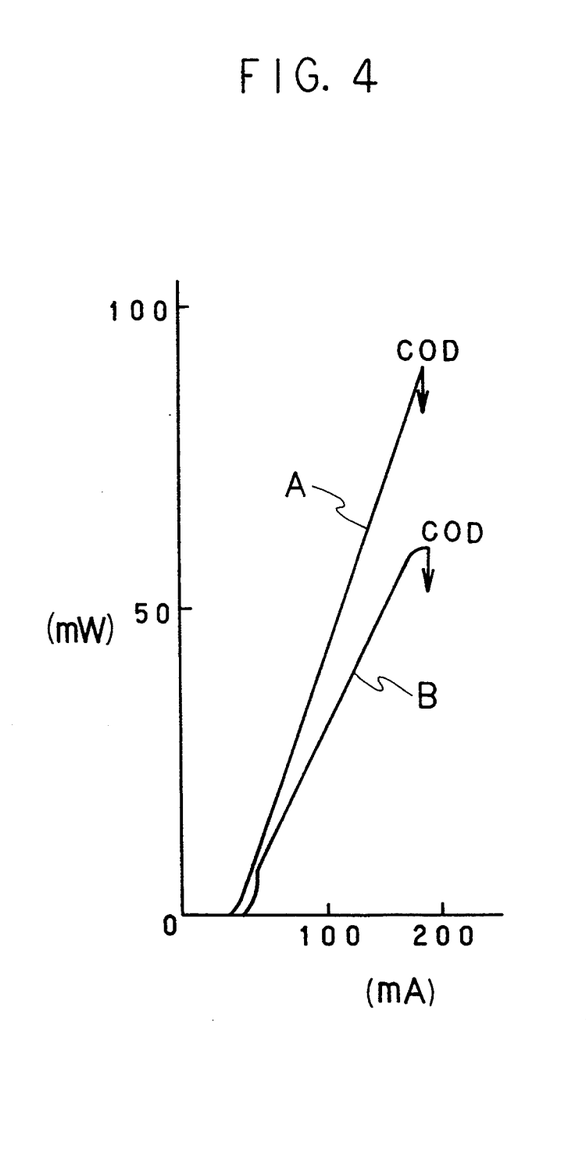
FIG. 4 is a graphic representation showing the current-light output characteristic and COD level of each of Examples 1 and 2 of the semiconductor laser according to the present invention.

To be described next with reference to FIGS. 3 and 4 is one embodiment of the process for fabricating a semiconductor laser according to the present invention. It is noted that this embodiment is applied to the fabrication of an SAM (Self-Aligned-structure-by-MBE) type semiconductor laser which is excellent in controllability and mass-productivity in particular and which has been disclosed in Japanese Examined Patent Publication No. 37873/1989 by the present applicant.

First, semiconductor substrate 5 such as made of GaAs of a first conductivity type is placed in an MBE apparatus to sequentially grow thereon lower clad layer 6 such as made of $Al_xGa_{1-x}As$ ($0.35 \leq x \leq 0.70$) of the first conductivity type as having 10000 to 20000 Å thickness, quantum well active layer 7 of a stacked structure comprising two to five alternately stacked layers of non-doped or of first or second conductivity type, for example, $Al_yGa_{1-y}As$ ($0 \leq y \leq 0.15$) layer having 50 to 150 Å thickness and $Al_zGa_{1-z}As$ ($0.15 \leq z \leq 0.35$) layer having 30 to Å thickness, first upper clad layer 8 such as made of $Al_xGa_{1-x}As$ of the second conductivity type as having 2000 to 4000 Å thickness, current-blocking layer 9, such as made of GaAs of the first conductivity type as having 4000 to 8000 Å thickness, evaporation-preventive layer 10 such as made of $Al_pGa_{1-p}As$ ($0.1 \leq p \leq 0.7$) of the first conductivity type having 600 to 800 Å thickness, and surface-protective layer 15 such as made of GaAs of non-doped type as having 300 to 500 Å thickness. These layers thus grown are generally referred to as first growth layer 16. Evaporation-preventive layer 19 serves to prevent current-blocking layer 10 from evaporating upon evaporation of surface-protective layer 15 in the MBE apparatus. If the evaporation of surface-protective layer 15 can be precisely controlled, evaporation-preventive layer 10 need not necessarily be provided.

Conventionally known methods are applicable to the epitaxy using MBE apparatus. According to one of such methods, source materials such as Ga which are accommodated in individual evaporation sources are made to evaporate in the form of molecular beam, and the temperature of each evaporation source and the shutter thereof are controlled by computer (not shown) while monitoring each source material using mass spectrometer (not shown), whereby a compound semiconductor of a desired composition can be epitaxially grown.

Next, semiconductor substrate 5 with first growth layer 16 is removed from the MBE apparatus and then the back side thereof is lapped. In turn, surface-protective layer 15 is covered with photoresist film 17 except a portion thereof in which stripe cavity 13 is to be formed. Using photoresist film 17 as a mask, surface-protective layer 15, evaporation-preventive layer 10 and current-blocking layer 9 are selectively etched so as to retain current-blocking layer 9 as having an appropriate thickness (for example, about 1000Å thickness), as shown in FIG. 3b. Thus, stripe cavity 13 is formed.

In turn, as shown in FIG. 3c, semiconductor substrate 5 is placed in the MBE apparatus again and heated up to about 740° to about 760° C. The heating is conducted for about 20 minutes while applying arsenic molecular beam to surface-protective layer 15 and current-blocking layer 9 retained in the aforesaid etching step, thereby evaporating current-blocking layer 9 retained on the bottom of stripe cavity 13 and surface-protective layer 15. In this case the evaporation rate of GaAs increases as the heating temperature rises, but the evaporation rate of AlGaAs changes little. Hence, only the GaAs layer can be selectively evaporated without evaporating first upper clad layer 8 and evaporation-preventive layer 10 both made of AlGaAs. In other words, without affecting first upper clad layer 8, only the unnecessary portion of current-blocking layer 9 which is retained on stripe cavity 13 can be completely removed while the rest of current-blocking layer existing around stripe cavity 13 are retained. At the same time with this, contaminants attached to the structure in the previous etching step are evaporated as well as surface-protective layer 15. Although first upper clad layer 8 is exposed in stripe cavity 13 by the evaporation step, any contaminant will not be attached thereto since the evaporation step is performed in the MBE apparatus.

Subsequently, with the temperature of semiconductor substrate 5 being set at about 580° to about 600° C., on the surface of the resulting structure are sequentially stacked second upper clad layer 11 such as made of $Al_xGa_{1-x}As$ of the second conductivity type as having 6000 to 18000 Å thickness, and contact layer 12 such as made of GaAs of the second conductivity type as having 10000 to 30000 Å thickness, as shown in FIG. 3d.

In turn, as shown in FIG. 3e, contact layer 12 is covered with photoresist film 18 except opposite end portions thereof.

In turn, as shown in FIG. 3f, step 14 is formed as having a length $L_1$ of about 10 to about 30 μm in each of the opposite end portions of contact layer 12 by selective etching using a selective etchant such as a mixed liquid of $NH_4OH$, $H_2O_2$ and $H_2O$ with a proportion of 10:100:1000 or of KOH, $H_2O_2$ and $H_2O$. If over-etching is performed using the same etchant, contact layer 12 is laterally etched at its under part along the interface to form undercut portion 19, whereby a step having an upper part projecting like an eaves as shown in FIG. 2b can be formed in the laser-light-emitting edge portion. Even if an etchant such as a mixed liquid of $H_2SO_4$, $H_2O_2$ and $H_2O$ is used instead of the selective etchant, etching reaches second upper clad layer 11 and, hence, ohmic contact is not provided between second upper clad layer 11 and electrode in the edge portion. Accordingly, a current-electrode noninjection region is formed in the edge portion.

The step formation method is not limited to the selective etching by masking. The following method, for instance, can be employed therefor. Prior to the formation of contact layer 12 such as made of GaAs of the second conductivity type, silicon oxide or the like is formed in a region intended for a step; contact layer 12 is then epitaxially grown; and the silicon oxide is removed. In this case contact layer 12 is not deposited on the silicon oxide, accordingly the removal of the silicon oxide results in the formation of the step.

Semiconductor substrate 5 thus formed with the semiconductor layers is lapped at its back side, followed by the formation of electrodes 2 and 3 on the surface of contact layer 12 and on the back side of semiconductor substrate 5, respectively. The resultant is cut into chips to complete semiconductor laser chips each having a width W of about 2 to about 6 μm and a length L of about 10 to about 30 μm as shown in FIG. 1. In the laser chip thus formed second electrode 2 is separated into electrodes 2a and 2b by step 14.

Although the process of the present invention is used to form an AlGaAs-type laser in the above description, the process is also applicable to the formation of a semiconductor laser of another material, such as InGaAlP-type laser or InGaAs-type laser. Further, although it is preferable to form the step in the laser-light-emitting edge portion so as to prevent the deterioration or damage of the edge portion which tends to generate Joule's heat, the provision of step is effective in any portion where the problem of local heat generation will occur.

Further, although the step has a depth larger than the thickness of the contact layer in the above embodiment, it may have a depth smaller than the thickness of the contact layer.

The process of the present invention is applicable to semiconductor lasers of any structure as well as of the SAM structure.

According to the present invention, a current-noninjection region can be provided merely by forming a step in the electrode-forming surface without changing the structure adjacent active layer 7 and the current-confining structure, such structures dominating the characteristics of the semiconductor laser. Therefore, the present invention will contribute to facilitated fabrication of semiconductor lasers and increased productivity.

The present invention will be described in more detail by way of examples.

EXAMPLE 1

Using a known MBE apparatus, there were sequentially stacked on n-GaAs substrate 5 n-$Al_{0.60}Ga_{0.40}As$ lower clad layer 6 of about 20000 Å thickness, stacked quantum well active layer 7 of about 500 Å thickness comprising four non-doped $Al_{0.10}Ga_{0.90}As$ layers each of about 95 Å thickness and three intervening non-doped $Al_{0.30}Ga_{0.70}As$ layers each of about 40 Å thickness, p-$Al_{0.60}Ga_{0.40}As$ first upper clad layer 8 of about 3000 Å thickness, n-GaAs current-blocking layer 9 of about 5000 Å thickness, n-$Al_{0.15}Ga_{0.85}As$ evaporation-preventive layer 10 of about 700 Å thickness, and non-doped GaAs surface-protective layer 15 of about 400 Å thickness.

In turn, semiconductor substrate 5 thus formed with the semiconductor layers was removed from the MBE apparatus; surface-protective layer 17 is covered with photoresist film 17, which was then patterned to open a region intended for a stripe cavity; and stripe cavity 13 of about 4 µm width was formed by using an etchant of a mixed liquid comprising $H_2SO_4$, $H_2O_2$ and $H_2O$. In the formation of stripe cavity 13 the etching was stopped to retain about 1000 Å thick current-blocking layer in the stripe cavity. This is because complete removal of the current-blocking layer in the cavity would result in too much etching against first upper clad layer 8 or in contamination of the exposed surface of first upper clad layer 8 by oxidation or the like. Hence, the retained GaAs layer served as a protective layer and was able to be selectively evaporated by the MBE apparatus.

Next, semiconductor substrate 5 thus processed was placed in the MBE apparatus again and subjected to a heat treatment at about 740° C. for about 20 minutes. As a result, the GaAs layer of current-blocking layer 9 which was retained in stripe cavity 13 was evaporated and first upper clad layer 8 came to be exposed. At the same time with this, surface-protective layer 15, contaminants attached to the surface and the like were also removed by evaporation. The surfaces of exposed upper clad layer 8 and current-blocking layer 9 were not oxidized or contaminated since the evaporation process was conducted in the MBE apparatus.

In turn, with the temperature of semiconductor substrate 5 being set at 600° C., there were sequentially stacked on substrate 5 p-$Al_{0.60}Ga_{0.40}As$ second upper clad layer 11 of about 17000 Å thickness and p-GaAs contact layer 12 of about 15000 Å thickness.

Subsequently, semiconductor substrate 5 thus formed with the semiconductor layers was removed from the MBE apparatus again; contact layer 12 was covered with photoresist film 18, which was then patterned to open opposite end portions intended for the formation of step; and step 14 having a length $L_1$ of about 20 µm and a depth D of about 1.5 µm was formed in each of the opposite end portions by etching with use of an etchant comprising $H_2SO_4$, $H_2O_2$ and $H_2O$. This etching was conducted to such an extent that second upper clad layer 11 was slightly etched (refer to FIG. 3f).

Finally, the resulting structure was lapped, provided with first electrode 3 and second electrode 2, and then diced and cleaved to complete a semiconductor laser chip having a width W of about 250 µm and a length L of about 350 µm. In the semiconductor chip thus formed, electrode 2 was completely separated into electrodes 2a and 2b by step 14.

FIG. 4 shows the current-light output characteristic and COD (catastrophic optical damage) level of the thus obtained semiconductor laser together with, for comparison, those of a conventional semiconductor laser having a bulk active layer and provided with a current-noninjection region but not with a step in the edge portion. In FIG. 4 reference character A indicates the characteristic of the semiconductor laser according to the present Example while reference character C indicates that of the conventional semiconductor laser. As apparent from FIG. 5, the semiconductor laser of this Example exhibited a current-light output characteristic of good linearity even in a low power zone, and further it was far superior in threshold current (a current value at which light begins to be output) and in COD level to the conventional semiconductor laser.

EXAMPLE 2

A semiconductor laser of the same size with Example 1 was fabricated in the same manner as in Example 1 except that a non-doped $Al_{0.12}Ga_{0.88}As$ bulk active layer of 500 Å thickness was provided for active layer 7 instead of the quantum well active layer. The current-light output characteristic and COD level of the thus fabricated laser was as indicated by reference character B in FIG. 4.

As apparent from FIG. 4, the semiconductor laser of the present Example was improved in COD level characteristic by 30% as compared with the conventional semiconductor laser having a bulk active layer with no provision of a step, though it was slightly inferior to the laser of Example 1. Further, the semiconductor laser of this Example was found to exhibit a prolonged life about five times as long as the life of the conventional laser when subjected to a reliability test.

EXAMPLE 3

Figure 5:
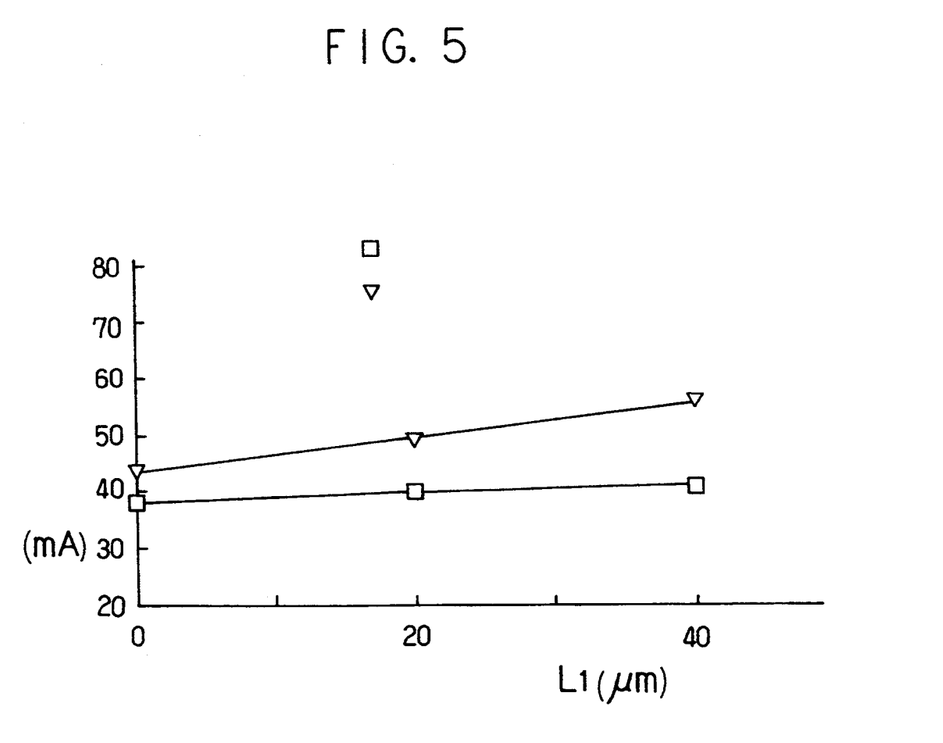
FIG. 5 is a graphic representation showing the relation between the threshold current and the length of the current-noninjection region in the edge portion in Example 3 of the semiconductor laser according to the present invention.

Three types of semiconductor lasers with the length $L_1$ of step being set at 0, 20 and 40 µm, respectively, were fabricated in a manner similar to that for Example 1. These lasers were examined for the dependence of threshold upon the length $L_1$ of current-noninjection region at a temperature of 29° C. For comparison, there were also fabricated semiconductor lasers as having individual sizes as same as the sizes of the above lasers and each having a current-noninjection region comprised of a current-blocking layer with no provision of step and a DH bulk active layer. The semiconductor lasers according to the present Example and the comparative lasers were examined for absorption loss and the results were as shown in FIG. 5. As apparent from FIG. 5, the comparative semiconductor laser having DH bulk active layer (indicated by reference character B) exhibited a threshold current increased by 27% when $L_1$ was 40 µm, while the semiconductor laser (indicated by reference character A) of the present Example exhibited little increase in threshold current even when $L_1$ is lengthened and, hence, its absorption loss was extremely small.

Further, an electric conduction test by APC (Auto Power Control) driving was conducted under the conditions of 60° C. and 35 mW with respect to the semiconductor laser with a current-noninjection region having a length $L_1$ of 20 µm according to the present Example as well as to the conventional laser of the same size having a bulk active layer. The results of the test revealed that the laser of this Example exhibited a prolonged life about three times as long as that of the semiconductor laser with a bulk active layer.

EXAMPLE 4

The fabrication process for a semiconductor laser of this Example was the same as in Example 2 until the formation of contact layer 12. The semiconductor laser was characterized by the provision of the undercut portion 19 in contact layer 12. Specifically, the undercut portion 19 was formed as follows. Contact layer 12 was covered with photoresist film 18, which was then patterned to open its opposite end portions; the exposed opposite end portions were etched, then overetched using a selective etchant ($NH_4OH:H_2O_2:H_2O = 10:100:1000$) to form a step with undercut portion 19 in each end portion. By the overetching contact layer 12 was laterally etched toward the center along the interface between contact layer 12 and second upper clad layer 11 to form the undercut portion 19. As a result the upper part of step 14 was shaped like an eaves (refer to FIG. 2b).

The resulting structure was lapped at its back side, provided with first and second electrodes 3 and 2, and then cleaved to complete the semiconductor laser chip. In the laser chip thus obtained, second electrode 2 was completely separated into electrodes 2a and 2b by step 14.

In Example 4, as described above, step 14 is provided in the electrode-forming surface to make electrode 2b open without changing the structure adjacent the active layer and the current-confining structure which dominate the characteristics of the semiconductor laser. Hence, a current-noninjection region can be formed in the region having a step, such as the region adjacent the laser-light-emitting edge. Further, the provision of undercut portion 19 in the lower portion of step 14 makes it possible to assuredly separate the electrode into two at a location adjacent an edge thereby assuredly providing a current-noninjection region in the region adjacent the edge.

Consequently, a highly reliable semiconductor laser can be obtained of which device characteristics are prevented from deteriorating due to local heat generation which is likely particularly in the region adjacent the light emitting edge.

EXAMPLE 5

Figure 6:
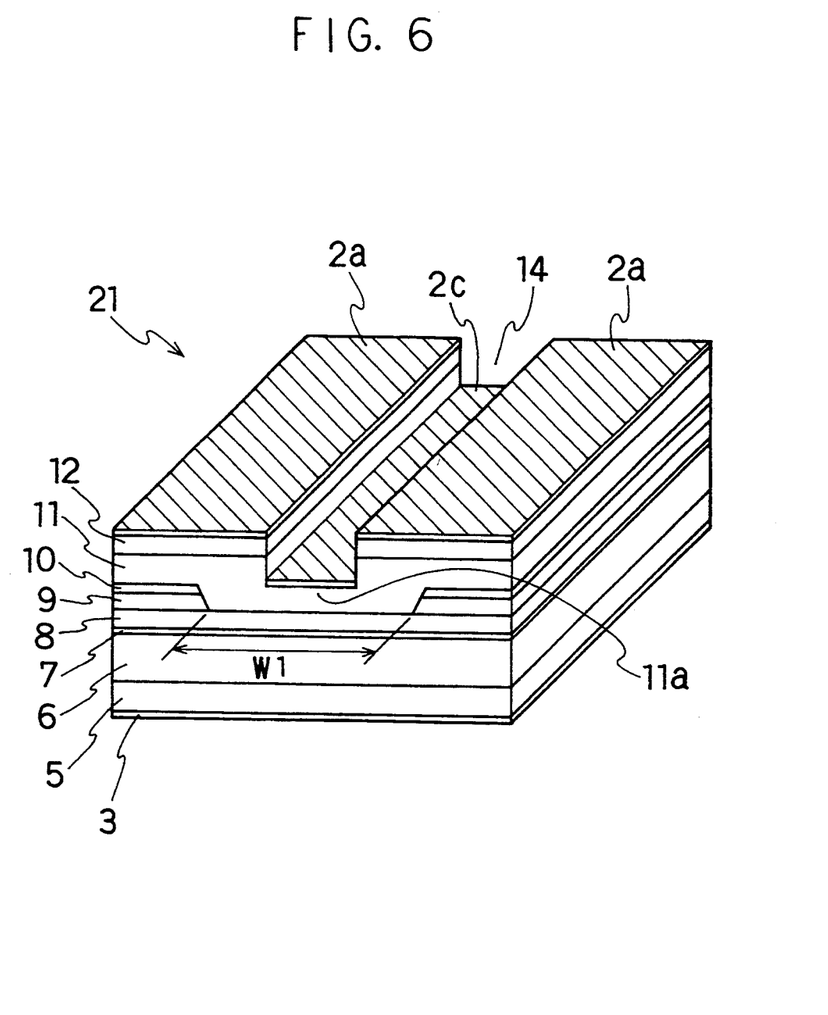
FIG. 6 is a perspective view showing the structure of Example 5 of the semiconductor laser according to the present invention.

FIG. 6 shows broad-area type semiconductor laser 21 to which the present invention is applied. As shown in FIG. 6, the broad-area type semiconductor laser has a broadened current path having a width $W_1$ of several ten to several hundred micrometers. The width $W_1$ of the usual current path is several micrometers. By thus broadening the current path the density of light per unit area can be lowered. Therefore, damage of the laser-light-emitting edge portion due to generation of heat can be prevented and, hence, the output of laser light can be enhanced as a whole.

As shown in FIG. 6, in broad-area type semiconductor laser 21 is provided step 14 which extends substantially parallel to and centrally of current path 11a in a location above current path 14. Step 14 separates second electrode 2 into electrodes 2a and 2c, whereby current is prevented from concentrating toward current path 11a and, hence, a laser device of high output can be realized.

In broad-area type semiconductor lasers in general, current tends to concentrate in the central portion more intensively with increasing width of the current path. Such intensively concentrated current causes the central portion of the current path to generate heat and, hence, the light output is restricted by heat saturation. In other words, there arises a problem that even if the current path is broadened to obtain an increased output, the light output cannot be so enhanced than expected. Broad area type semiconductor laser 21 of the present Example is able to suppress heat generation due to concentrated current.

Broad area type semiconductor laser 21 may further be provided with a step in the laser-light-emitting edge to have separated electrodes like semiconductor laser 1. If so, semiconductor laser 21 will output a higher light power since its light emitting edge is prevented from being damaged.

It should be noted that although broad-area type semiconductor laser 21 has a step extending substantially centrally of current path 11a, the location of the step is not particularly limited thereto and the step may be in any location above current path 11a to prevent local heat generation at such a location. Further, the step may be provided in plural locations.

According to the semiconductor laser of the present invention, as has been described, the step locally provided on at least one side of the electrode-forming surface assuredly separates the electrode into two in a location adjacent an edge of the laser. Hence, a current-noninjection region can be formed in a region adjacent the laser-light-emitting edge thereby preventing local heat generation. Thus, deterioration of device characteristics due to local heat generation can be prevented without changing the structure adjacent the active layer and the current-confining structure which dominate the device characteristics of the semiconductor laser.

If a quantum well structure is employed for the active layer, the light absorption in the current-noninjection region can be reduced. Hence, a highly reliable semiconductor laser can be obtained which exhibits a current-light output characteristic of good linearity even in a low power zone.

Further, if an undercut portion is provided in the upright surface of step formed on one side of the electrode-forming surface to make the step have an eaves, the electrode is assuredly separated into two at a location adjacent an edge by such a step. Hence, a current-noninjection region can be formed in a region adjacent the laser-light-emitting edge. Accordingly, a highly reliable semiconductor laser can be obtained which can prevent deterioration of device characteristics without changing the structure adjacent the active layer and the current-confining structure which dominate the characteristics of the semiconductor laser.

Further, if the step provided on one side of the electrode-forming surface is made larger in depth than the thickness of the contact layer, deterioration of device characteristics due to local heat generation can be assuredly prevented. This results in a semiconductor laser of higher reliability.

Further, if the step is formed in a region adjacent the laser-light-emitting edge, deterioration of the laser-light-emitting edge portion due to generation of heat can be prevented. This results in a semiconductor laser which exhibits a good current-light output characteristic and a prolonged life.

Though several embodiments of the present invention are described above, it is to be understood that the present invention is not limited only to the above-mentioned embodiments, and various changes and modifications may be made in the invention without departing from the spirit and scope thereof.

What is claimed is:

1. A semiconductor laser device comprising:
    a first electrode provided on a first electrode-forming-surface;

a second electrode provided on a second-electrode-forming surface; and a plurality of semiconductor layers provided between the first and second electrodes, the plurality of semiconductor layers including at least a) an active layer;

b) a lower clad layer provided between the first electrode and the active layer and formed of a semiconductor of a first conductivity type, the semiconductor having a refractive index smaller than that of the active layer and a forbidden band width larger than that of the active layer;

c) an upper clad layer provided between the second electrode and the active layer and formed of a semiconductor of a second conductivity type, the semiconductor of the second conductivity type having a refractive index smaller than that of the active layer and a forbidden band width larger than that of the active layer; and d) a contact layer provided between the upper clad layer and the second electrode and formed of a semiconductor having a refractive index larger than that of the active layer and a forbidden band width smaller than that of the active layer, wherein the second-electrode-forming surface is partially provided with a step which separates the second electrode wherein said step has an undercut portion in an under part to define an upper portion in a form of eaves.

2. The semiconductor laser device of claim 1, wherein said plurality semiconductor layers are individually formed of $Al_qGa_{1-q}As$ ($0 \leq q \leq 1$) and adjusted in refractive index and forbidden band width by varying the content of Al.

3. The semiconductor laser device of claim 1, wherein said step has a depth larger than the thickness of the contact layer.

4. The semiconductor laser device of claim 1, wherein said step is provided in a laser-light-emitting edge portion.

5. The semiconductor laser device of claim 1, wherein said active layer is of a quantum well structure.

6. The semiconductor layer device of claim 5, wherein said plurality semiconductor layers are individually formed of $Al_qGa_{1-q}As$ ($0 \leq q \leq 1$) and adjusted in refractive index and forbidden band width by varying the content of Al.

7. The semiconductor layer device of claim 6, wherein said quantum well structure is a stacked structure comprising an $Al_yGa_{1-y}As$ ($0 \leq y \leq 0.15$) layer and an $Al_zGa_{1-z}As$ ($0.15 \leq z \leq 0.35$) layer.

8. The semiconductor laser device of claim 5, wherein said step has a depth larger than the thickness of the contact layer.

9. The semiconductor laser device of claim 5, wherein said step is provided in a laser-light-emitting edge portion.

10. A semiconductor laser device comprising:

a first electrode;

a lower clad layer provided on the first electrode;

an active layer provided on the lower clad layer;

an upper clad layer provided on the active layer;

a contact layer provided on the upper clad layer;

a step formed in the upper clad layer and the contact layer; and a second electrode provided on the contact layer and the upper clad layer, a part of the second electrode on the contact layer being separated from a remaining part of the second electrode on the upper clad layer by said step, wherein the lower clad layer is formed of a semiconductor of a first conductivity type having a refractive index smaller than that of the active layer and a forbidden band width larger than that of the active layer, the upper clad layer is formed of a semiconductor of a second conductivity type having a refractive index smaller than that of the active layer and a forbidden band width larger than that of the active layer, and the contact layer is formed of a semiconductor having a refractive index larger than that of the active layer and a forbidden band width smaller than that of the active layer.

11. A semiconductor laser device comprising:

a first electrode;

a lower clad layer provided on the first electrode;

an active layer provided on the lower clad layer;

an upper clad layer provided on the active layer;

a current blocking layer provided in the upper clad layer, the current blocking layer split into two parts to define a current path therebetween;

a contact layer provided on the upper clad layer, a step formed in the upper clad layer and the contact layer above said current path, the step extending parallel to said current path; and a second electrode provided on the contact layer and the upper clad layer, a part of the second electrode on the contact layer being separated from a remaining part of the second electrode on the upper clad layer by said step, wherein the lower clad layer is formed of a semiconductor of a first conductivity type having a refractive index smaller than that of the active layer and a forbidden band width larger than that of the active layer, the upper clad layer is formed of a semiconductor of a second conductivity type having a refractive index smaller than that of the active layer and a forbidden band width larger than that of the active layer, and the contact layer is formed of a semiconductor having a refractive index larger than that of the active layer and a forbidden band width smaller than that of the active layer.

* * * * *